United States Patent
Higashiguchi et al.

[19]
[11] Patent Number: 6,127,634
[45] Date of Patent: *Oct. 3, 2000

[54] WIRING BOARD WITH AN INSULATING LAYER TO PREVENT GAP FORMATION DURING ETCHING

[75] Inventors: Yutaka Higashiguchi; Masao Hosogai; Hiroyuki Otaguro; Hitoshi Yokemura; Masaharu Hida, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/490,083

[22] Filed: Jun. 13, 1995

[30] Foreign Application Priority Data

Oct. 11, 1994 [JP] Japan ..................... 6-245206

[51] Int. Cl.⁷ ..................................... H01R 9/09
[52] U.S. Cl. ..................... 174/262; 174/260; 174/252
[58] Field of Search ..................... 174/262, 263, 174/264, 265, 266, 252, 52.4, 52.5, 52.6, 260; 361/767, 768, 777, 778, 803

[56] References Cited

U.S. PATENT DOCUMENTS

| | | | |
|---|---|---|---|
| 4,729,061 | 3/1988 | Brown | 174/262 X |
| 5,461,197 | 10/1995 | Hiruta et al. | 174/52.4 |
| 5,471,366 | 11/1995 | Ozawa | 257/724 |
| 5,473,120 | 12/1995 | Ito et al. | 174/264 |
| 5,506,755 | 4/1996 | Miyagi et al. | 174/252 X |

FOREIGN PATENT DOCUMENTS

| | | |
|---|---|---|
| 55-53489 | 4/1980 | Japan . |
| 62-16983 | 9/1987 | Japan . |
| 1-199460 | 8/1989 | Japan . |
| 1-305592 | 12/1989 | Japan . |
| 2-5596 | 1/1990 | Japan . |
| 2-267956 | 11/1990 | Japan . |
| 3-30392 | 2/1991 | Japan . |
| 4-44256 | 2/1992 | Japan . |

*Primary Examiner*—Jeffrey Gaffin
*Assistant Examiner*—Kamand Cuneo
*Attorney, Agent, or Firm*—Armstrong, Westerman, Hattori, McLeland, & Naughton

[57] ABSTRACT

A wiring board structure includes a board made of a material which can be etched by a given solution, an electrically conductive portion, which is thermally conductive, having a portion which extends from the board and which can be etched by the given solution, and an insulating layer having a portion which is in contact with the board and only the side surface of the electrically conductive portion and which prevents the board from being etched when the electrically conductive layer is etched.

8 Claims, 13 Drawing Sheets

FIG. 5A  GREEN SHEET PUNCHING

GREEN SHEET

FIG. 5B  VIA FILLING/ LAYERING

FIG. 5C  INSULATOR DEPOSITING

FIG. 5D  PATTERNING

FIG. 5E  DEVELOP/HEAT TREATMENT

FIG. 5F  SURFACE CONDUCTOR FORMING

WIRING BOARD WITH AN INSULATING LAYER TO PREVENT GAP FORMATION DURING ETCHING

BACKGROUND OF THE INVENTION

1. Field of the Invention

The present invention generally relates to wiring boards, and more particularly, to a wiring board having a solid surface on which discrete parts and/or a thin-film multilayer structure is provided and to a wiring board having a thick-film multilayer wiring layer structure formed therein.

2. Description of the Related Art

Figure 1:
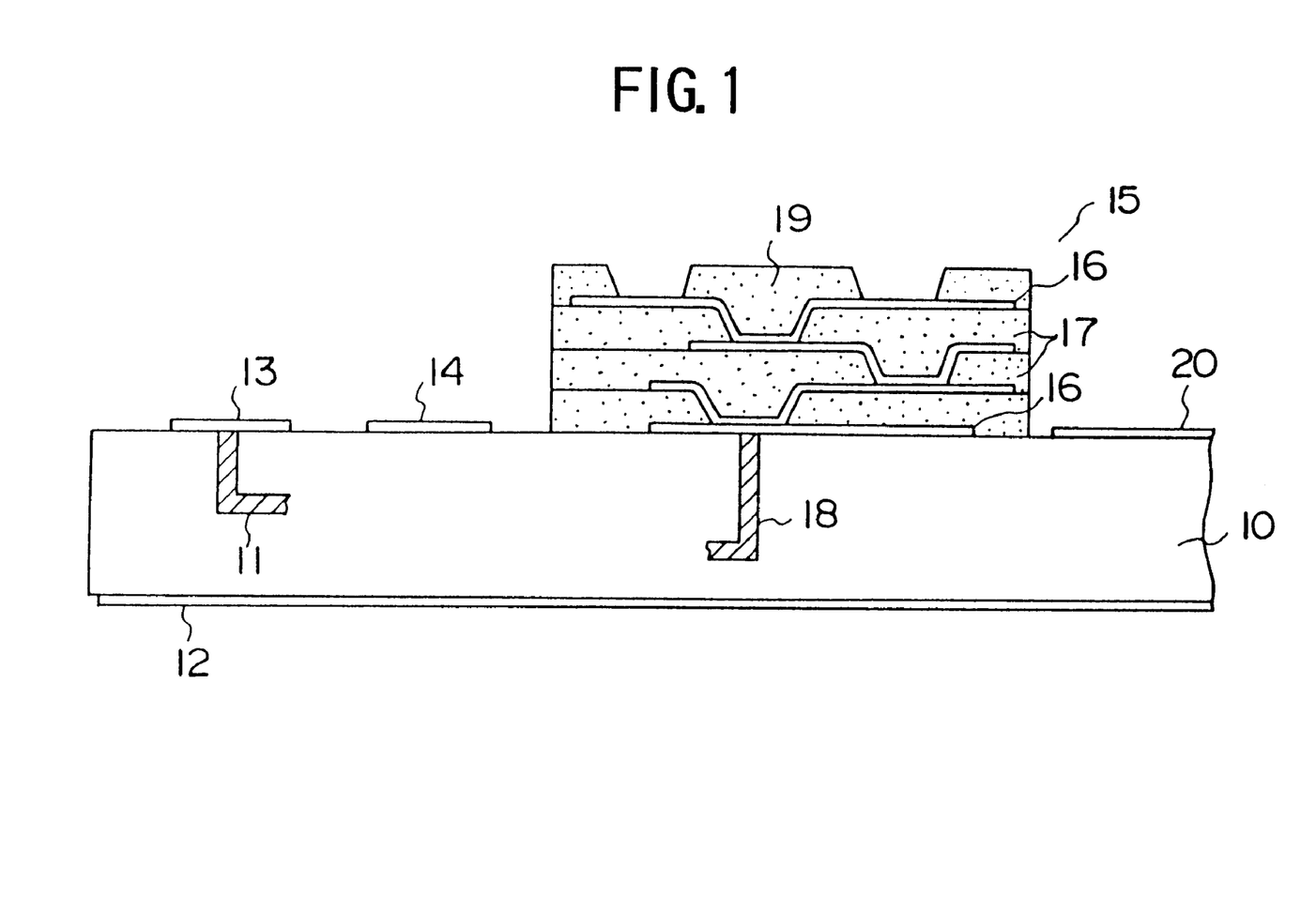
FIG. 1 is a diagram of a related wiring board structure (based on the inventor's knowledge)

FIG. 1 shows an aluminum nitride (AlN) board related to the present invention (based on the inventor's knowledge). An AlN board 10 has inner conductive wiring layers 11 and 18 formed in a stacked formation. The inner conductive wiring layers 11 and 18 are made of an electrically conductive material such as tungsten (W) or molybdenum (Mo). The stacked formation of the wiring layers can be formed by a thick-film printing technique and a burn-in technique. Generally, a metallic layer 12, which may have a Cu/Ni/Au structure, is formed on the back surface of the Al board 10 taking into account the electrical performance. A cover pad 13 is provided on the front surface of the AlN board 10 (in other words, a circuit pattern formation surface). The cover pad 13 covers the inner conductive wiring layer 11 extending up to the front surface from an inner portion of the board 10. Generally, the cover pad 13 has a Ti/Cu/Ni/Au structure. The cover pad 13 is electrically connected to the inner conductive wiring layer 11, and is used as a pad provided on a peripheral surface area of the board 10 and is used to input or output a signal. There is another cover pad 14, which is not connected to any inner conductive layer. Generally, the cover pad 14 has the same structure as the cover pad 13, and is used to fix a casing on the board 10. Electronic parts (elements) such as LSI chips are mounted on the board 10 and then a cover is provided to hermetically seal the board 10 and the parts.

A multilayer wiring structure 15 is provided on the front surface of the AlN board 10. The multilayer wiring structure 15 has a stacked unit made of copper and polyimide. Copper wiring layers 16 are stacked between polyimide layers 17. Via holes are formed in the polyimide layers 17, and the upper wiring layers 16 are electrically in contact with the lower wiring layers 16 or an inner conductive wiring layer 18. For example, the copper wiring layers 16 are 25 μm wide and 7 μm thick, and the polyimide layers 17 are 25 μm thick. A soldering resist layer 19 made of polyimide is provided on the top of the uppermost copper wiring layer 16. A die pad metallic layer 20 is formed on the front surface of the AlN board 10.

Figure 2A:
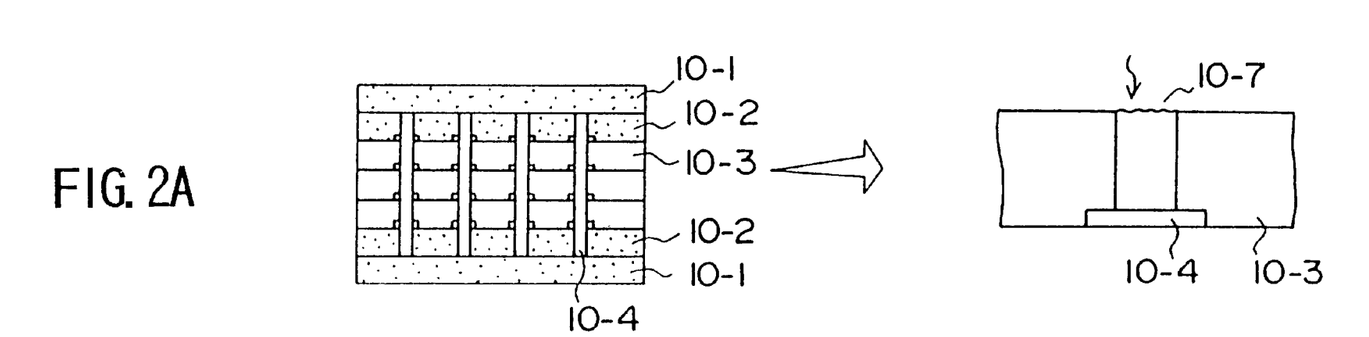
FIGS. 2A, 2B and 2C are diagrams of a production process for the structure shown in FIG. 1 and an encountered problem to be solved (based on the inventor's knowledge)
Figure 2B:
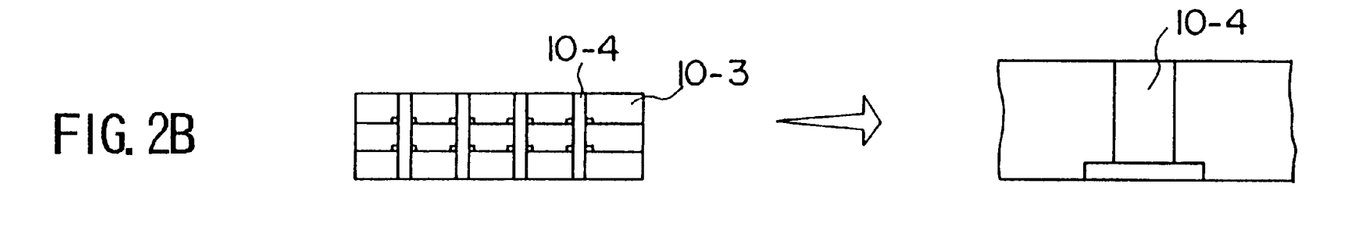
Figure 2C:
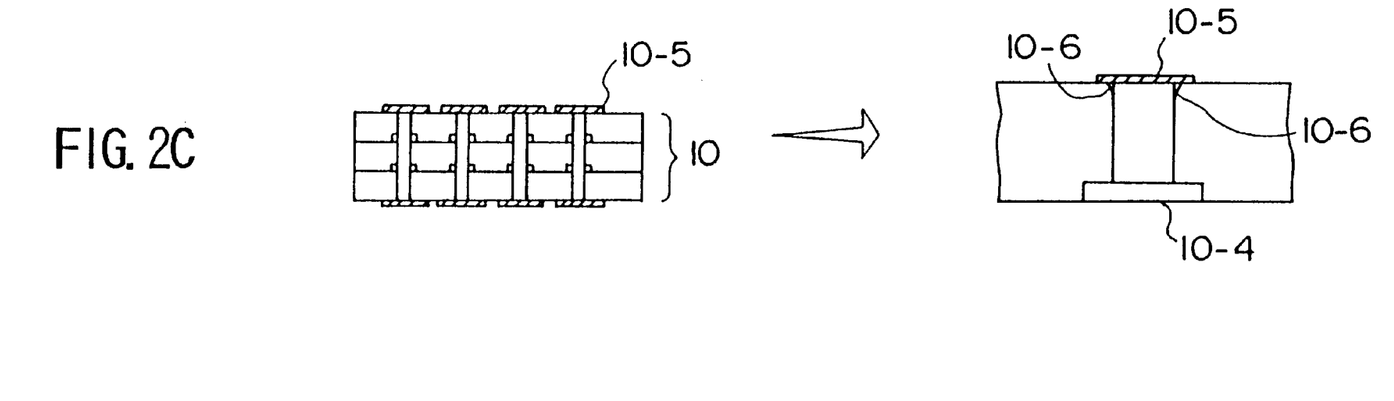

FIGS. 2A, 2B and 2C are diagrams showing the structure of the AlN board 10 and its production method. As shown in FIG. 2A, a stacked-layer structure is formed. A plurality of insulating layers 10-3 made of AlN are stacked and dummy layers 10-1 and 10-2 formed of AlN are provided as shown in FIG. 2A. Inner conductive wiring layers 10-4 are formed in the dummy layers 10-2 and the insulating layers 10-3. The inner conductive wiring layers 10-4 correspond to the aforementioned inner conductive wiring layers 11 and 18 shown in FIG. 1. The inner conductive wiring layers 10-4 extend in the vertical and horizontal directions. The above stacked structure shown in FIG. 2A is baked. Then, the dummy layers 10-1 and 10-2 are polished. The inner conductive layers 10-4 are formed by the thick-film printing technique, and therefore the surface thereof has a roughness 10-7 equal to a few microns as shown in FIG. 2A. A conductive thin film cannot be formed on such as rough surface. Thus, the dummy layers 10-1 and 10-2 are polished so that the inner conductive wiring layers 10-4 have flat exposed surfaces, as shown in FIG. 2B. Thereafter, as shown in FIG. 2C, cover pads 10-5 are provided so as to cover the exposed surfaces of the inner conductive wiring layers 10-4.

Generally, AlN material is eroded and melted (etched) by an alkali solution which may be NaOH or KOH. The cover pads 10-5 shown in FIG. 2C are formed by growing a film on the entire surface of the structure by means of sputtering chromium (Cr) and then patterning the film. In the patterning process, a strong alkali solution (pottasium ferricyanide plus pottasium hydroxide) is used as an etching resist and etching liquid. Hence, as shown in FIG. 2C, in the process of forming the cover pads 10-5, the alkali solution infiltrates into the AlN layers 10-3, gaps 10-6 then being formed around the inner conductive wiring layers 10-5. The gaps 10-6 causes defective contacts between the inner conductive wiring layers 10-5 and the AlN layers 10-3 as well as defective via contacts. The above problem will occur even when an alkali solution is used to etch a metal other than Cr, such as Cu or Ti.

It may be possible to use a metal etched by a solution other than an alkali solution to form the pattern by a process not using any alkali solution. However, there will be large restrictions on the process of forming the pattern, and a good-quality multilayered board (wiring structure) cannot be realized.

SUMMARY OF THE INVENTION

It is a general object of the present invention to provide a wiring board structure, a method of producing the wiring board and a semiconductor device in which the above problem is eliminated.

A more specific object of the present invention is to provide a wiring board structure and its production method capable of realizing highly reliable via contacts with a large degree of freedom in selecting a metallic material and a production process.

The above objects of the present invention are achieved by a wiring board structure comprising:

a board made of a material etched by a given solution;

an electrically conductive layer having a portion which is in contact with the board and which can be etched by the given solution; and an insulating layer having a portion which is in contact with the board and the electrically conductive layer and which prevents the board from being etched when the electrically conductive layer is etched.

According to one aspect of the present invention, in the above wiring board structure, the board has a wiring layer, a via hole and a connection conductor provided in the via hole. The connection conductor connects the electrically conductive layer and the wiring layer. The insulating layer has a window via which the electrically conductive layer contacts the board. The window of the insulating layer has a size smaller than that of the via hole. With the above structure, it is possible to prevent the board from being etched in the vicinity of the window.

According to another aspect of the present invention, the electrically conductive layer has another portion which lies on the insulating layer. The wiring board structure further comprises another insulating layer provided on the electrically conductive layer, and another electrically conductive layer provided on the another insulating layer and contacting the electrically conductive layer.

According to yet another aspect of the present invention, the insulating layer is made of an insulating material which can be grown at a temperature lower than a burning temperature of a material making the board. Hence, it is possible to prevent the board from being damaged.

The above-mentioned objects of the present invention are also achieved by a wiring board structure comprising:

a board;

a multilayered wiring structure provided on the board; and a thermally conductive member provided in a hole formed in the multilayered wiring structure, a mounting element necessary for heat radiation providable therein so as to contact the thermally conductive member provided in the hole.

The above-mentioned objects of the present invention are also achieved by a wiring board structure comprising:

a multilayered wiring structure having first and second electrically conductive layers between which an insulating layer is interposed, and a contact portion which is formed in the insulating layer and connects the first and second electrically conductive layers;

first lands externally exposed and located in positions of the first electrically conductive layer; and second lands externally exposed and located in positions of the second electrically conductive layer, a measurement instrument for measuring a resistance of the contact portion being connectable to the first and second lands.

The above-mentioned objects of the present invention are also achieved by a semiconductor device comprising:

a multilayered board having an inner wiring layer;

mounting elements mounted on opposite surfaces of the multilayered board;

a mold resin covering the multilayered board and the mounting elements;

leads extending from the mold resin; and a heat radiating member connected to one of the mounting elements via the mold resin and located outside the mold resin.

According to one aspect, the multilayered board has a plurality of via holes and thermally conductive members provided in the via holes. The above one of the mounting elements is provided on a first surface of the multilayered board and is in contact with one of the thermally conductive members provided in a corresponding one of the via holes. The heat radiating member is provided on a second surface of the multilayered board and is in contact with the above one of the thermally conductive members.

According to another aspect of the present invention, the heat radiating member comprises a connecting member provided in the mold resin, and a heat radiating fin exposed to an outside of the mold resin.

The aforementioned objects of the present invention are also achieved by a method of producing a semiconductor device comprising the steps of:

(a) providing a multilayered wiring structure on a surface of a board and mounting first elements thereon;

(b) providing a first mold resin covering the multilayered wiring structure and the first elements;

(c) removing the board; and (d) mounting second elements on an exposed surface of the multilayered wiring structure and then providing a second mold resin covering the second elements.

According to one aspect, the method further includes a step of, before or after the step (a), providing an adhesive layer. According to another aspect, the step of providing the adhesive layer includes the step of sequentially providing a first adhesive portion and a second adhesive portion having different natures.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
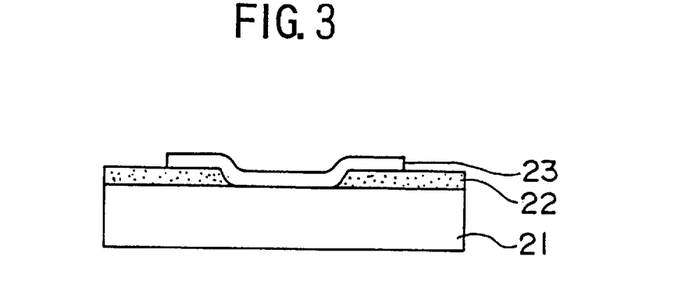
FIG. 3 is a diagram of a first embodiment of the present invention.

FIG. 3 shows the structure of a wiring board according to a first embodiment of the present invention. A reference number 21 indicates a board made of a material which is eroded and melted (etched) by an alkali solution. Such a material is, for example, a ceramic material. In the following description, the board 21 is made of aluminum nitride AlN. An insulating layer 22 is formed on a front surface of the AlN board 21. The insulating layer 22 is made of an insulating material which is not eroded and melted by an alkali solution. Examples of such an insulating material are an inorganic material such as glass and an organic material such as polyimide. The insulating layer 22 has a window via which an electrically conductive layer 23 is in contact with the surface of the AlN board 21.

The conductive layer 23 extends on the insulating layer 22. The conductive layer 23 is made of a metallic material that can be eroded and melted by an alkali solution, such as Cr. The conductive layer 23 is formed by growing a film of Cr on the entire front surface and etching the film with an alkali solution. The insulating layer 22 prevents the AlN board 21 from being exposed to the alkali solution. Hence, there is no possibility that a gap is formed in an area in the vicinity of the interface between the conductive layer 23 and the AlN board 21. In the above manner, the insulating layer 22 having resistance to alkaline is provided at a position which protects the AlN board 21 from being exposed to the alkali solution.

It is preferable that the insulating layer 22 be made of polyimide because polyimide has good chemical resistance and good heat resistance and can be used as a cover material required not to be affected by a chemical solution used in the normal thin-film forming process. Further, polyimide has a burn-in temperature (approximately 400° C.) lower than that of AlN (approximately 1400° C.).

The AlN board 21 may have an inner layer (thick-film multilayered wiring structure) or may be a bulk or solid having no inner layer.

Figure 4:
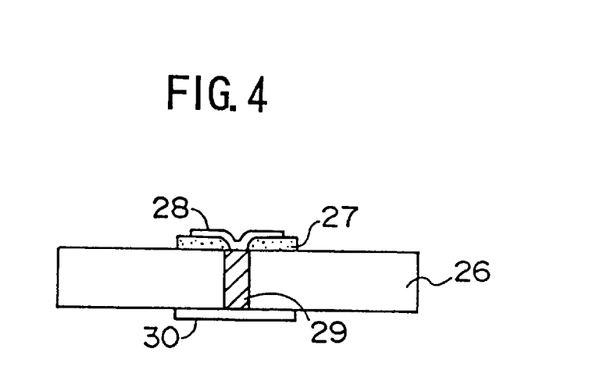
FIG. 4 is a diagram of a first variation of the first embodiment of the present invention.

FIG. 4 is a diagram of a variation of the first embodiment of the present invention. A via hole is formed in an AlN board 26, and an inner conductive layer 29 is formed therein. An inner conductive layer 30 connected to the inner conductive layer 29 is provided on the back surface of the AlN board 26. A polyimide insulating layer 27 is provided on the front surface of the AlN board 26, and a conductive layer 28 is connected to the inner conductive layer 29 via a window formed in the polyimide insulating layer 27. The diameter of the window of the insulating layer 27 is smaller than that of the inner conductive layer 29. Hence, the AlN board 26 can be prevented from being exposed to an alkali solution in the etching process for the conductive layer 28. The insulating layer 27 functions as a protection layer which protects the AlN board 26 from the alkali solution. The inner conductive layer 29 is formed so it covers the inner wall of the window or fills the inner wall.

Figure 5A:
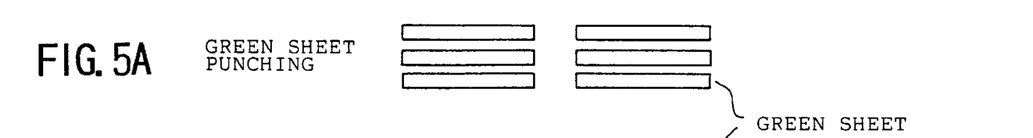
FIGS. 5A, 5B, 5C, 5D, 5E and 5F are diagrams of a process of producing the first variation shown in FIG. 4.
Figure 5B:
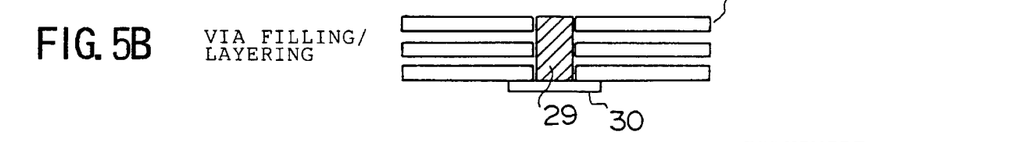
Figure 5C:
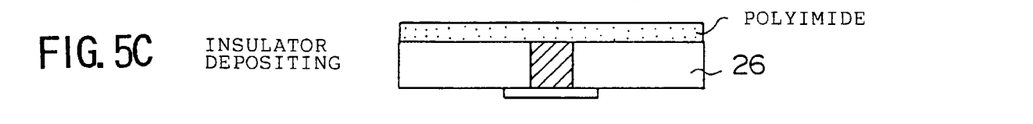
Figure 5D:
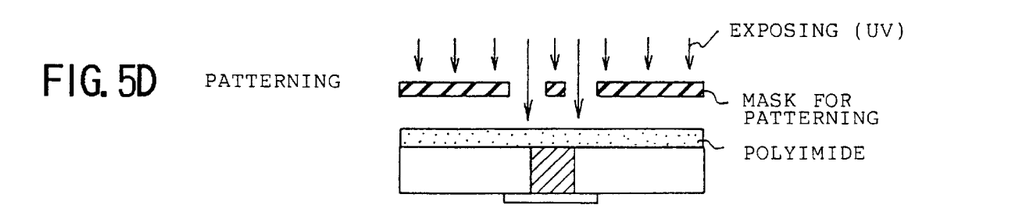
Figure 5E:
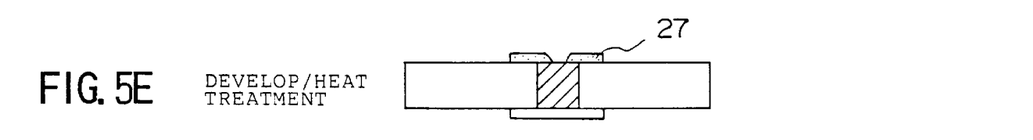
Figure 5F:
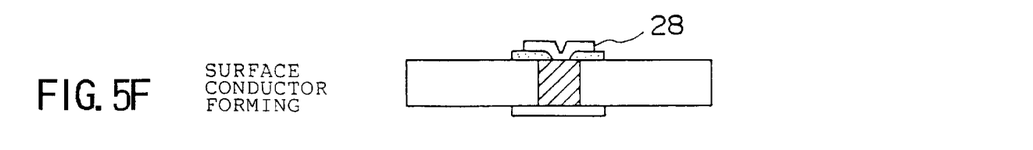

FIGS. 5A through 5F are diagrams of steps of producing the wiring board shown in FIG. 4. As shown in FIG. 5A, Green sheets are punched so that via holes are formed therein. As shown in FIG. 5B, the inner conductive layers 29 and 30 are formed, and the Green sheets are stacked. As shown in FIG. 5C, polyimide is deposited on the entire front surface of the stacked structure. As shown in FIG. 5D, the polyimide layer is exposed by ultra-violet rays, using a mask for patterning. As shown in FIG. 5E, a develop process and a heat treatment are carried out so that the polyimide insulating layer 27 is formed. The insulating layer 27 has a window via which the inner conductive layer 29 is partially exposed. A metal is deposited on the entire front surface, and is then etched so that the conductive layer 28 is formed, as shown in FIG. 5F. In this step, the insulating layer 27 covers the contact between the inner conductive layer 29 and the AlN board 26. Hence, it is possible to prevent formation of gaps, which are encountered in the related art.

Figure 6:
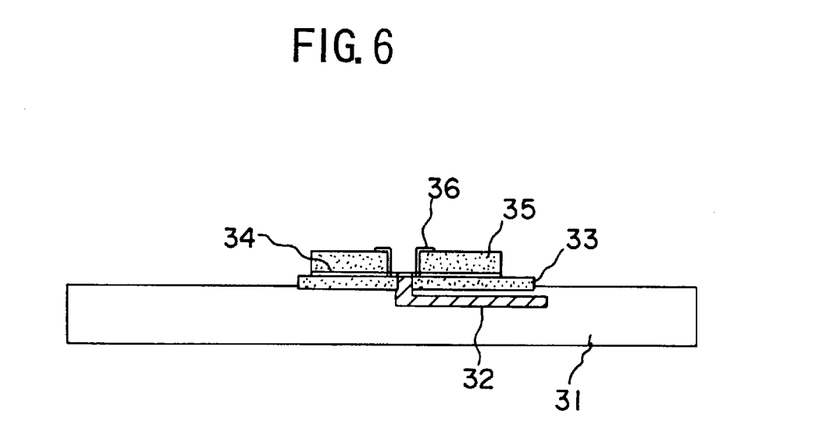
FIG. 6 is a diagram of a second variation of the first embodiment of the present invention.

A description will now be given, with reference to FIG. 6, of a second variation of the first embodiment of the present invention. An insulating layer 33, which may be made of polyimide, is provided on an AlN board 31 having an inner conductive wiring layer 32. A wiring layer 34 is formed on the insulating layer 33. The inner conductive wiring layer 32 and the conductive wiring layer 34 are connected via a conductor provided in a via hole formed in the insulating layer 33. An insulating layer 35 made of, for example, polyimide, is provided on the conductive wiring layer 34. A surface conductive layer 36 is provided on the insulating layer 35 and in a via hole formed therein. The insulating layer 33 covers the exposed sides of the inner conductive layer 32, and hence the AlN board 31 can be prevented from formation of gaps therein.

Figure 7:
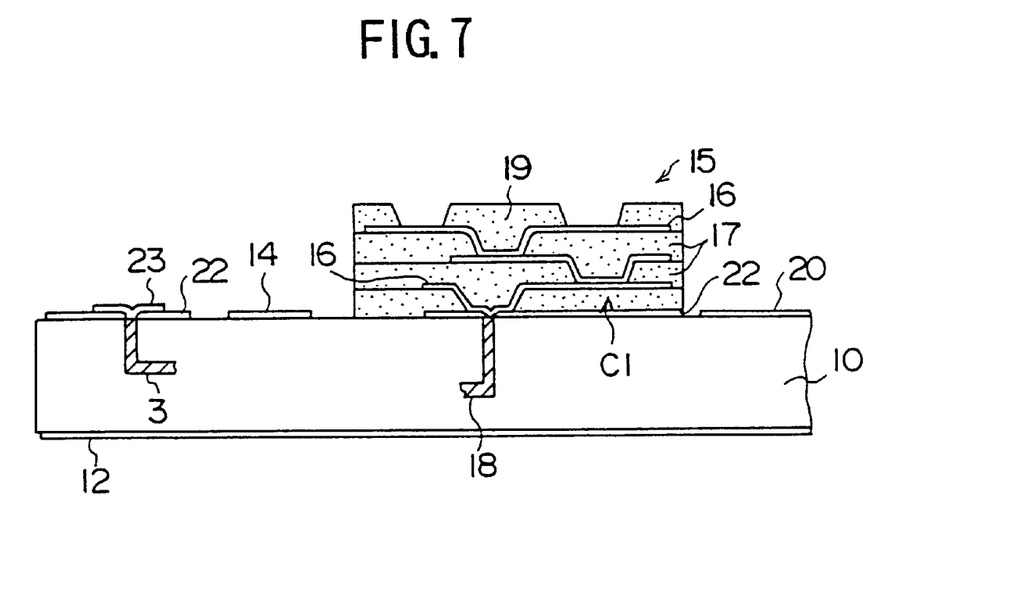
FIG. 7 is a diagram of an application of the first embodiment of the present invention.

FIG. 7 is diagram of a multichip module which is an application of the wiring board configured according to the first embodiment of the present invention. In FIG. 7, parts that are the same as those shown in the previously described figures are given the same reference numbers. The structure shown in FIG. 7 differs from the structure shown in FIG. 1 in that the structure shown in FIG. 7 has the insulating layer 22 made of, for example, polyimide. The insulating layer 22 underlies the lower portion of the conductive layer 23 and the copper/polyimide multilayered wiring structure 15. The insulating layer 22 functions to prevent formation of gaps which may be located in a surface portion of the AlN board 10 in the vicinity of the inner conductive wiring layer 3 connected to the conductive layer 23, and another surface portion thereof in the vicinity of the inner conductive wiring layer 18 connected to the lowermost copper wiring layer 16 of the structure 15.

The copper wiring layers 16 may be provided on the insulating layer 22 underlying the copper/polyimide multilayered wiring structure 15. An LSI chip may be provided on the structure 15 although it is omitted for the sake of simplicity.

Figure 8:
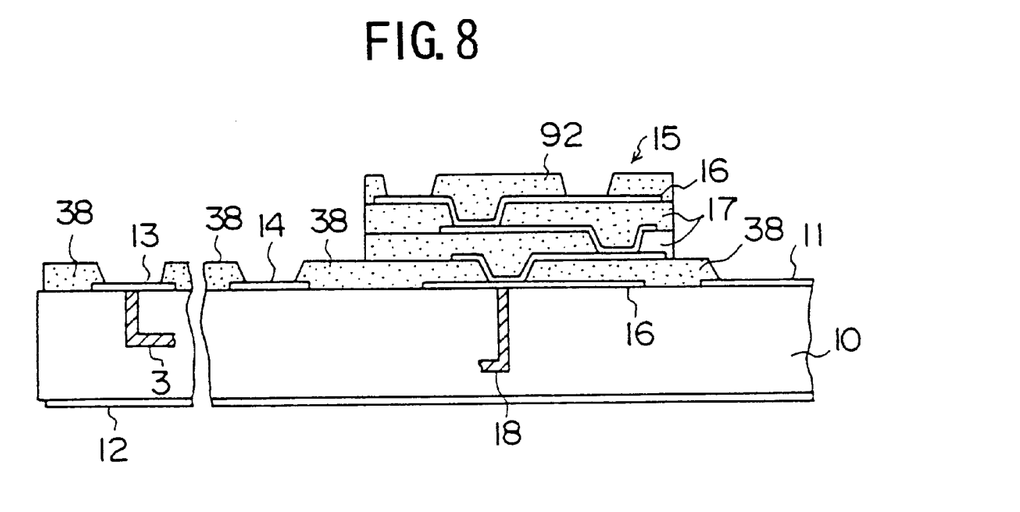
FIG. 8 is a diagram of another application of the first embodiment of the present invention.
Figure 9:
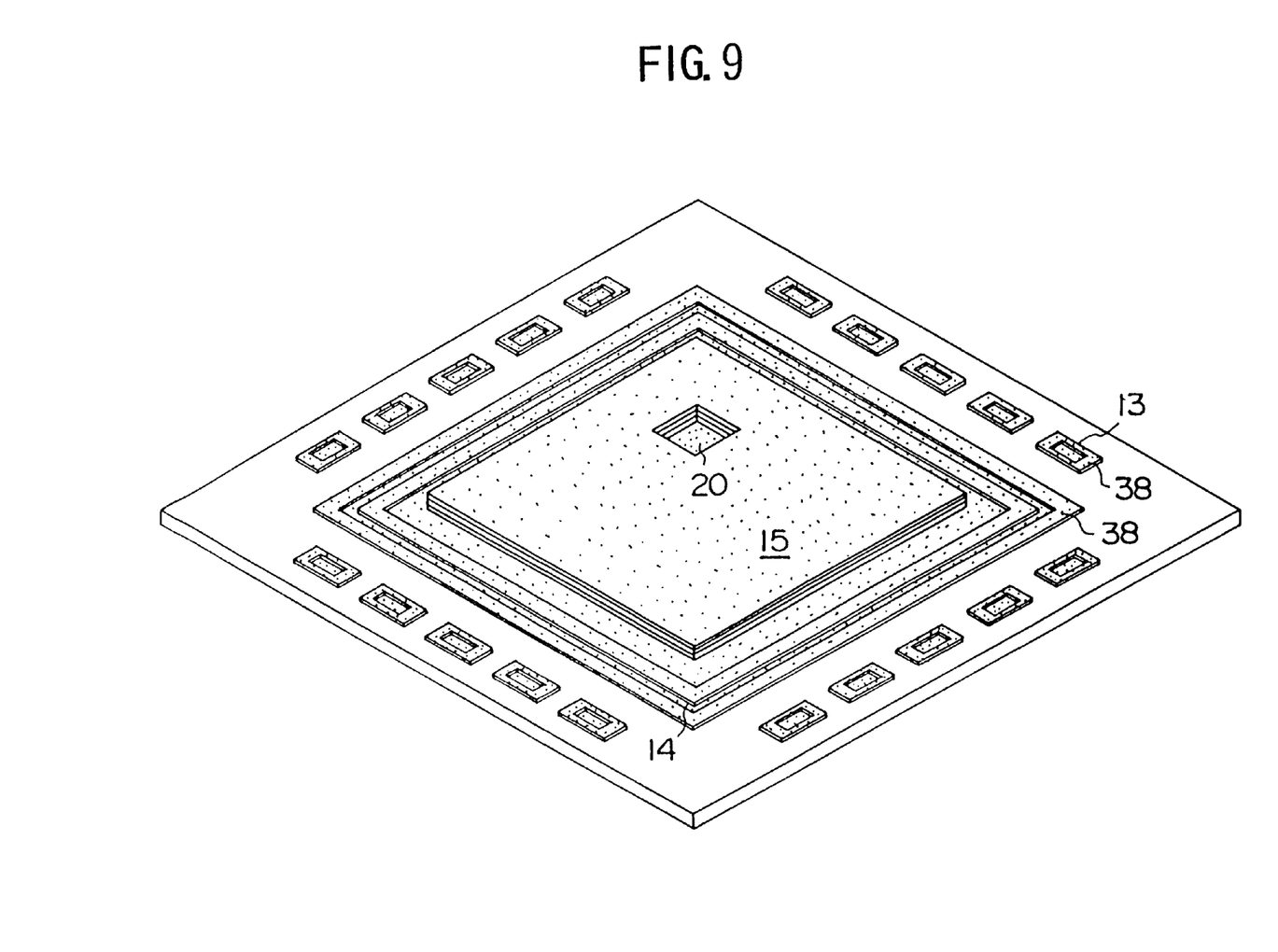
FIG. 9 is a perspective view of the variation shown in FIG. 8.

As has been described previously, gaps formed in the AlN board shown in FIG. 2C lead to various problems. However, there is a possibility that a surface portion of the AlN board other than the surface portions in which the inner wiring layers are exposed may be eroded and melted by an alkali solution. For example, there is a possibility that the board surface may be eroded and melted from an edge portion of the conductive layer provided on the AlN board in a process after the above conductive layer. Taking into account the above, as shown in FIGS. 8 and 9, alkaline-resistant insulating layers 38 made of, for example, polyimide may be provided so as to cover the edges of the conductive layers formed on the AlN board 10. The insulating layers 38 make it possible that the surface of the AlN board 10 is not affected by the subsequent processes.

The structure shown in FIG. 8 is an improvement of the structure shown in FIG. 1, and in practice it is desirable that the insulating layers 22 shown in FIG. 7 be employed to the structure shown in FIG. 8.

A description will now be given, with reference to FIGS. 10A through 10D, of a second embodiment of the present invention. The second embodiment of the present invention relates to a semiconductor device having a multichip module structure in which mounting parts such as LSI chips are mounted on two opposing surfaces of the copper/polyimide multilayered wiring structure. First of all, the process of producing the above semiconductor device will be described below.

Figures 10A, 10B:
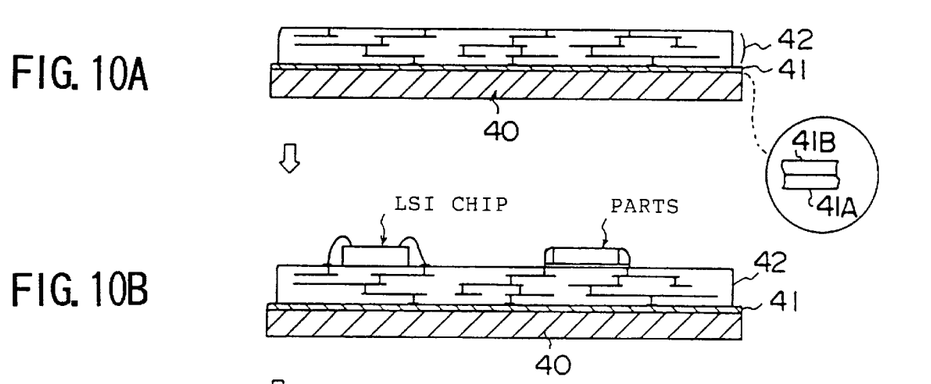
FIGS. 10A, 10B, 10C and 10D are diagrams of a semiconductor and its production process according to a second embodiment of the present invention.

As shown in FIG. 10A, an adhesive layer 41 is formed on a base 40 having a size of 90 mm×90 mm. The base 40 may be a ceramic material such as AlN. A copper/polyimide multilayered wiring structure 42 is formed on the adhesive layer 41. The adhesive layer 41 has two layers which hardly diffuse into each other or do not diffuse at all. For example, a Cr layer 41A is deposited to 1000 Å on the base 40, and a Cu layer 41B is deposited to 2000 Å on the Cr layer 41A.

Figure 10C:
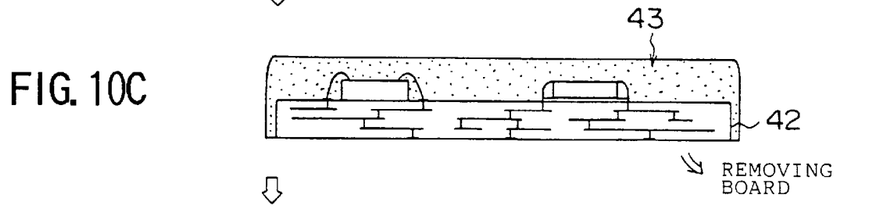

Next, as shown in FIG. 10B, LSI chips and mounting parts are mounted on the copper/polyimide multilayered wiring structure 42 by means of wire bonding and/or soldering. Then, as shown in FIG. 10C, a mold resin 43 made of, for example, epoxy-based resin, is provided by insert molding so that the copper/polyimide multilayered wiring structure 42 is covered. Thereafter, the base 40 is removed (for example, mechanically). At this time, the two layers of the adhesive layer 41 are detached from each other. More particularly, the Cr layer 41A is removed together with the base 40, while the Cu layer 41B is retained on the copper/polyimide multilayered wiring structure 42. The remaining Cu layer 41B is removed by dry etching such as sputtering or wet etching. The adhesive layer 41 can be easily divided into two layers, and the process of removing the base 40 can be facilitated.

Figure 10D:
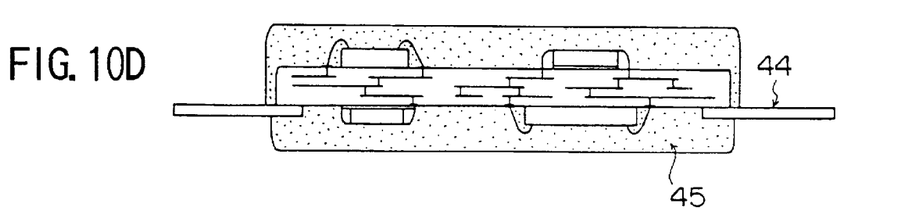

As shown in FIG. 10D, wiring patterns and pads are provided on the exposed copper/polyimide multilayered wiring structure 42 by a thin-film forming process. Then, leads 44 are attached to the pads on the structure 42. Finally, a mold resin 45 is provided so that the structure 42 is hermetically sealed.

As described above, the second embodiment of the present invention is a semiconductor device having a copper/polyimide multilayered wiring structure which has two opposing surfaces on which LSI chips and electronic parts are mounted and which is totally molded by resin. The copper/polyimide multilayered wiring structure 42 is as thin as 0.1 mm and as thick as 0.2 mm at maximum. Further, the largest distance between the parts mounted on the two opposite surfaces of the structure 42 is approximately 2 mm. The mold resin layers 43 and 45 can be made thin, and therefore the total thickness of the semiconductor device (multichip module) shown in FIG. 10D is equal to or less than 3 mm. The density of mounting parts is very high because there is no limitation regarding mounting of parts on the two opposite surfaces of the structure 42.

Figure 11:
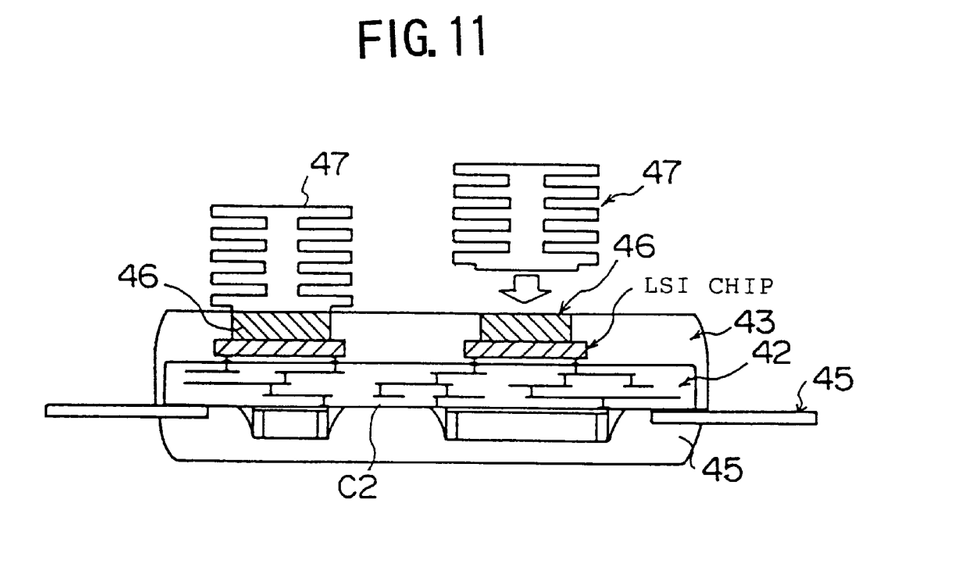
FIG. 11 is a diagram of a first variation of the second embodiment of the present invention.

FIG. 11 is a diagram of a first variation of the second embodiment of the present invention. In FIG. 11, parts that are the same as those shown in FIGS. 10A through 10D are given the same reference numbers. The structure shown in FIG. 11 differs from that shown in FIG. 10D in that the structure shown in FIG. 11 is equipped with heat radiating fins 47. Openings are formed in the resin 43 with respect to mounted parts which need heat radiating, such as LSI chips. The openings are filled with chip/fin connecting members 46 made of a thermally conductive material such as a metallic material. The heat radiating fins 47 are fixed to the connecting members 46. The process for filling the openings with the connecting members 46 and attaching the heat radiating fins 47 can be carried out in the state shown in FIG. 10C or FIG. 10D.

Figure 12:
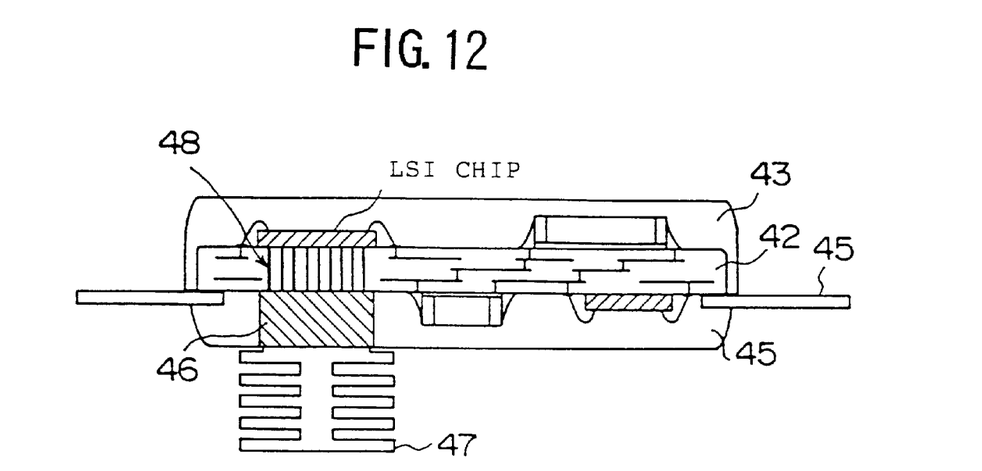
FIG. 12 is a diagram of a second variation of the second embodiment of the present invention.

FIG. 12 shows a second variation of the second embodiment of the present invention. In FIG. 12, parts that are the same as those shown in the previously described figures are given the same reference numbers. The structure shown in FIG. 12 is characterized in that heat radiating for mounted parts such as LSI chips is performed via the copper/polyimide multilayered wiring structure 42. A plurality of heat-radiating via holes 48 are formed in the copper/polyimide multilayered wiring structure 42, and are full of thermally conductive members. The connecting members 46 are in contact with the heat conducting materials in the via holes 48. The mounting parts to be subjected to heat radiating are in contact with the other sides of the heat conducting members. Heat from the mounting parts conduct through the heat conducting members and the connecting members 46 and is externally radiated via the heat-radiating fins 47.

The heat conductivity of polyimide is not high, and there is a case where heat cannot be effectively radiated from portions which are in contact with polyimide. However, in the structure shown in FIG. 12, heat is radiated from the bottom surfaces of the mounting parts (which face polyimide of the copper/polyimide multilayered wiring structure 42). Hence, heat radiating is very effective and efficient.

The via holes 48 for heat radiating can be formed in the state shown in FIG. 10A. A heat conducting material such as aluminum can be provided in the via holes 48 by, for example, a plating process. The number of heat-radiating via holes 48 and positions thereof can be determined taking into consideration various parameters, such as the amount of heat radiated from the mounting parts and the number of parts needed for heat radiating.

Figure 13:
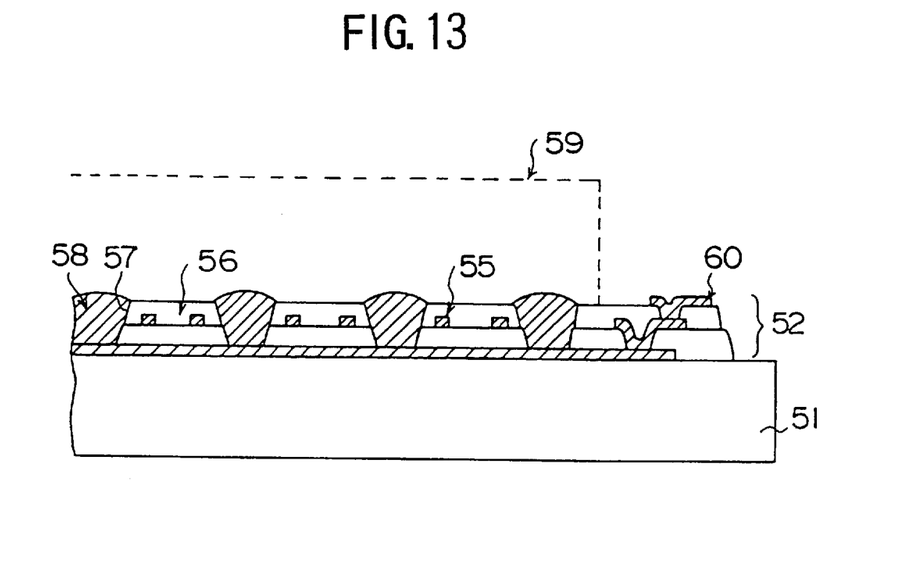
FIG. 13 is a diagram of an application of the second embodiment of the present invention.
Figure 14:
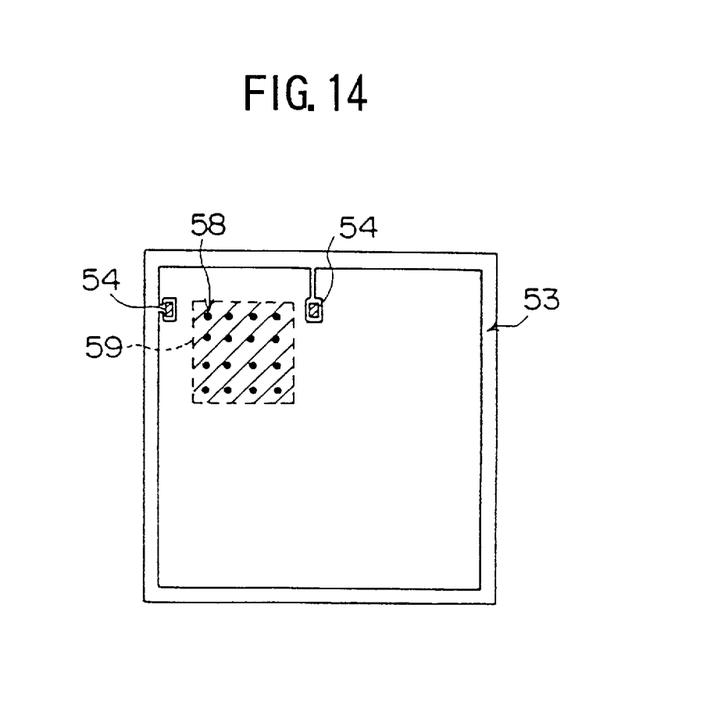
FIG. 14 is a plan view of the structure shown in FIG. 13.

The heat radiating method using the heat-radiating via holes shown in FIG. 12 can be applied to a wiring board shown in FIGS. 13 and 14.

A thin-film electrode pattern 53 made of, for example, copper, is formed, by sputtering, evaporation or the like, on the substantially entire surface of a board 51 made of, for example, ceramics, except for pads 54 connectable to electrodes of LSI chips. The thin-film electrode pattern is set to a predetermined potential equal to, for example, a ground potential, when it is used. A copper/polyimide multilayered wiring structure 52 is provided on the thin-film electrode pattern 53. The structure 52 includes copper lines 55 and an insulating layer 56 of polyimide.

A plurality of heat-radiating via holes 57 are formed in the copper/polyimide multilayered wiring structure 52 so that the via holes 57 are arranged in rows and columns. The via holes 57 are filled, by plating or the like, with heat conducting members 58 made of a metallic material having a good heat conductivity. A mounting part 59 which needs heat radiating (indicated by the broken line shown in FIGS. 13 and 14) is mounted on the heat conducting members 58. The heat-radiating via holes 57 are formed in the respective insulating layers of polyimide. At the same time as the heat-radiating via holes 57, openings for formation of electrodes are formed. Electrodes 60 that contact the thin-film conductive pattern 53 are provided in the above openings.

With the above structure, it becomes possible to effectively and efficiently radiate, in addition to heat radiating from the top surface of the mounting part 59, heat from the bottom surface thereof which is in contact with polyimide not having a good heat conductivity.

A description will now be given of a third embodiment of the present invention, which relates to a wiring board having a structure which enables easy measurement of contact resistances (connection resistances) between upper wiring lines and lower wiring lines in the multilayered wiring board.

Figure 15:
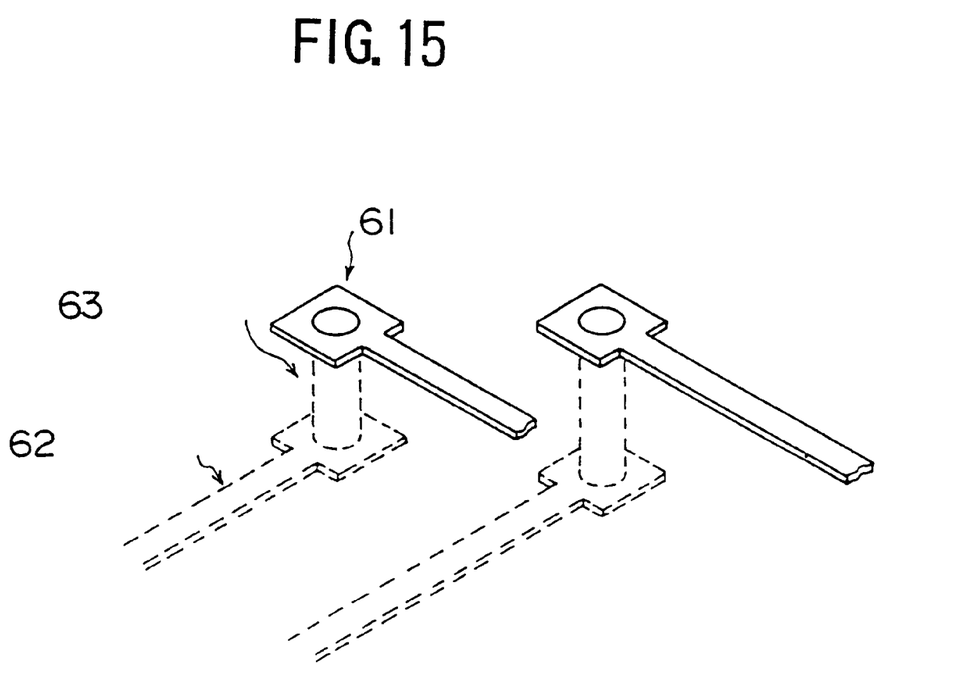
FIG. 15 is a perspective view of a contact between an upper conductive layer and a lower conductive layer.

FIG. 15 shows an interlayer contact (for example, contact C1 shown in FIG. 7 or contact C2 shown in FIG. 11) formed between layers in the copper/polyimide multilayered wiring structure 15 (thin-film structure) and the multilayered wiring board (thick-film structure). An upper wiring line (layer) 61 and a lower wiring line (layer) 62 between which an insulating layer is interposed are connected by an interlayer connection contact 63. The connection resistance of the contact 63 is influenced by the production process, and therefore it is necessary to check whether it is equal to or smaller than a given resistance value.

As is known, the copper/polyimide multilayered wiring structure can be formed as follows. A first electrically conductive layer is formed on an insulating layer by means of a thin-film/plating technique. Next, polyimide (photosensitive) is coated as an insulating layer. Openings for interlayer connections are formed in the above insulating layer by patterning, and are baked. Then, a second electrically conductive layer is formed on the above insulating layer by the thin-film/plating technique. At this time, the second wiring layer is arranged so as to cross the first wiring layer. The above process is repeatedly carried out until a desired multilayer structure can be obtained.

The process described above using a photosensitive organic material used to form an insulating layer has a disadvantage in that the organic material remains on a portion of the lower conductive wiring layer within the openings formed in the insulating layer, and increases the contact resistance. With the above in mind, the step of removing the remaining organic material is carried out to clean up the bottoms of the openings. This step reduces the contact resistance to approximately 1 mΩ.

However, the conductive wiring lines have a width as small as tens of microns, and thus have a large conductivity (1Ω/cm). Hence, it is very difficult to measure the contact resistance by touching probe terminals to the upper wiring layer 61 and the lower wiring layer 62 and evaluate the quality of contacts. The above holds true for the thick-film multilayered wiring board.

The third embodiment of the present invention has a structure which takes into account the above.

Figure 16A:
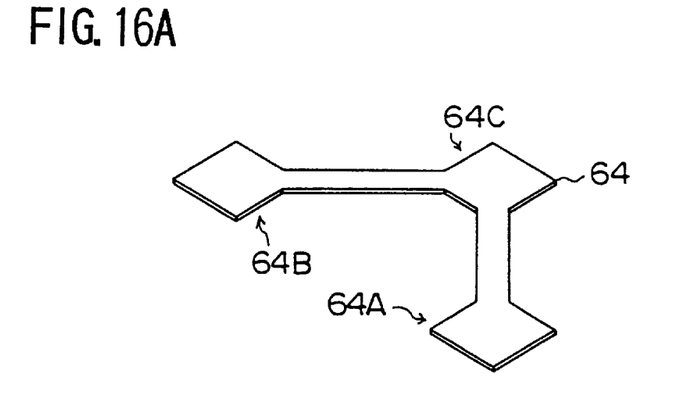
FIGS. 16A, 16B and 16C are diagrams of a process of producing the structure shown in FIG. 15.
Figure 16B:
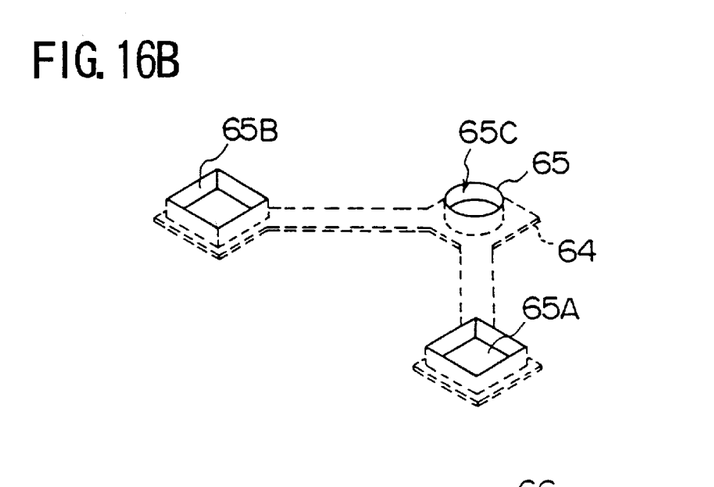
Figure 16C:
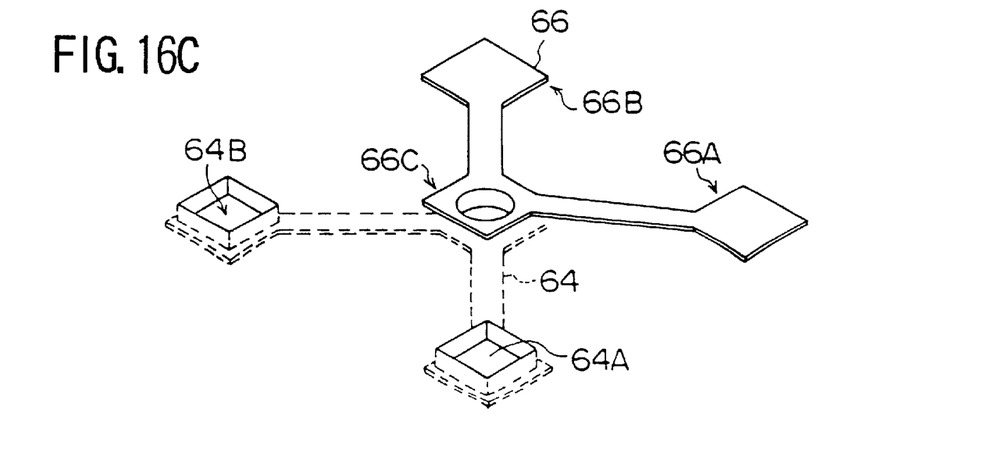

FIGS. 16A, 16B and 16C are perspective views of the third embodiment of the present invention. Referring to FIG. 16A, a first electrically conductive layer 64 is formed on an insulating layer by the thin-film/plating technique. The first conductive layer 64 has two measurement lands 64A and 64B and one connection land 64C. The measurement lands 64A and 64B extend in two directions from the connection land 64C.

As shown in FIG. 16B, a photosensitive material such as polyimide is coated on the first electrically conductive layer 64, and an opening 65C for exposing the connection land 64C and openings 65A and 65B for respectively exposing the measurement lands 64A and 64B are formed in the polyimide layer by patterning. Then, the polyimide layer is burned in, so that a polyimide insulating layer 65 is formed.

The connection land 64C of the first conductive layer 64 is etched via the opening 65C (the bottom of the opening 65C is etched), whereby the remaining polyimide is removed. Thereafter, as shown in FIG. 16C, a second electrically conductive layer 66 is formed using the same process as the first conductive layer 64. The second conductive layer 66 has almost the same shape as the first layer 64. More particularly, the second conductive layer 66 has two measurement lands 66A and 66B, and a connection land 66C. The second conductive layer 66 is formed so that the two conductive layers 64 and 66 form an approximately X shape. In the structure shown in FIG. 16C, the second conductive layer is located in the inner wall of the opening 65C and is in contact with the first conductive layer 64.

By using the four measurement lands 64A, 64B, 66A and 66B, a known four-terminal measurement method is performed to measure the resistance of the interlayer connection contact between the first and second layers 64 and 66.

Figure 17:
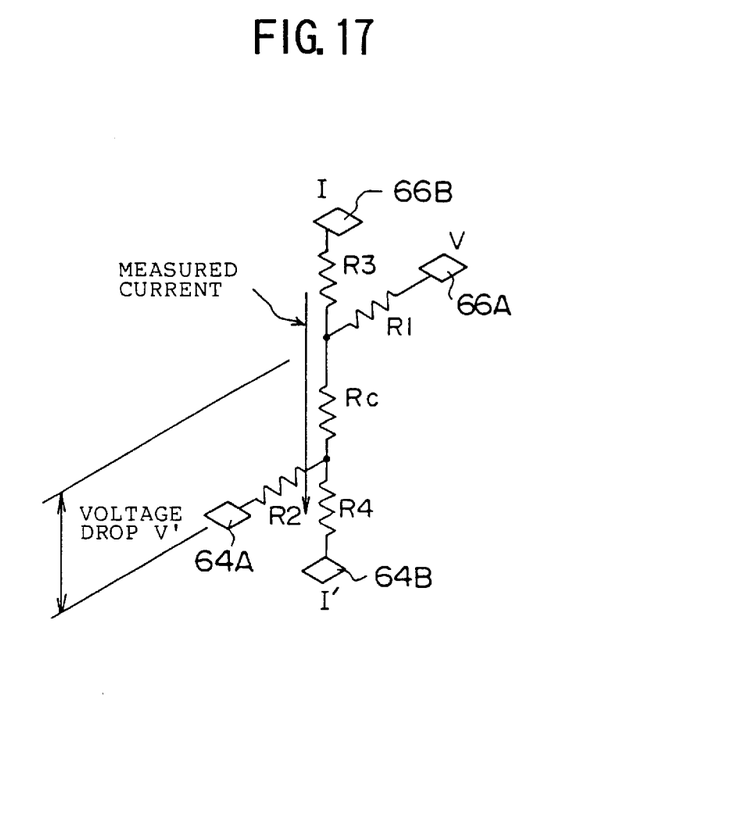
FIG. 17 is a diagram of a measuring principle according to a third embodiment of the present invention.

FIG. 17 is a circuit diagram of the above measurement method. Symbol Rc denotes the connection contact resistance, and R1 denotes the resistance between the contact part and the measurement land 66A of the second conductive layer 66. Further R3 denotes the resistance between the contact part and the measurement land 66B of the second conductive layer 66. R2 denotes the resistance between the contact part and the measurement land 64A of the first conductive layer 64. R4 denotes the resistance between the contact part and the measurement land 64B of the first conductive layer 64. A current is made to flow between the measurement lands 66B and 64B, and the voltage drop (V–V') across the measurement lands 66A and 64A is measured.

Figure 18:
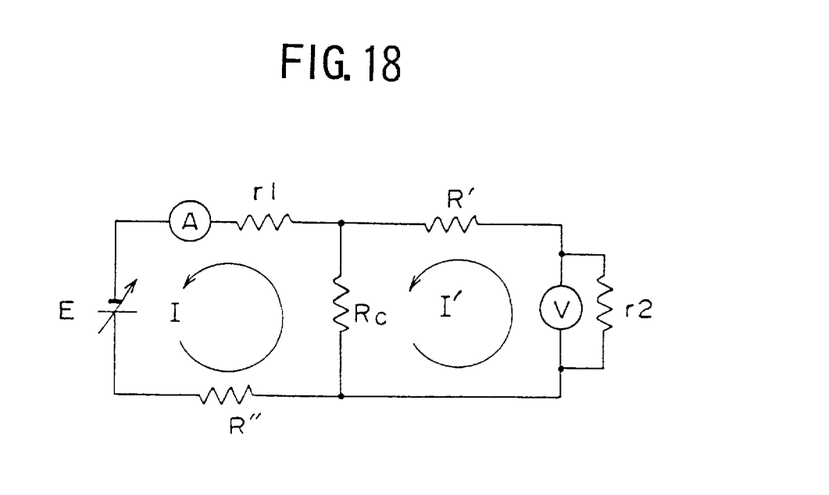
FIG. 18 is a circuit diagram of the measuring principle.

FIG. 18 is a circuit diagram of the above measurement method. In FIG. 18, R' corresponds to R3+R4 shown in FIG. 17, and R" corresponds to R1+R2 shown in FIG. 17. Further, the circuit shown in FIG. 18 includes a current detector A, a voltage detector V, a power source E, an internal resistance r1 of the current detector A, and an internal resistance r2 of the voltage detector V. Symbols I and I' respectively denote currents.

Normally, $r2 \gg Rc$, R', $R'' \gg r1$, and $I \gg I'$. In this case, the following expressions stand:

$$E = \{I(r1+Rc+R'')-I'Rc\} = I(Rc+R'')-I'Rc(Rc, R'' \gg r1) \approx IR''+IRc(I \gg I')$$

$$I \approx E/(R''+Rc) \text{ (constant current)}$$

$$0 = (I'-I)[Rc+I'R'+I'r2]$$

$$IRc \approx I'r2 \ (I \gg I', \ r2 \gg R')$$

$$Rc = V/I \ (V=I'r2).$$

As described above, the fine contact resistance can be precisely measured.

The structure shown in FIG. 16 is provided in a plurality of positions specifically arranged for measurement within the multilayered wiring structure, and the contact resistances are measured in the production process in order to easily determine whether the etching process for the interlayer openings has duly been performed.

Figure 19:
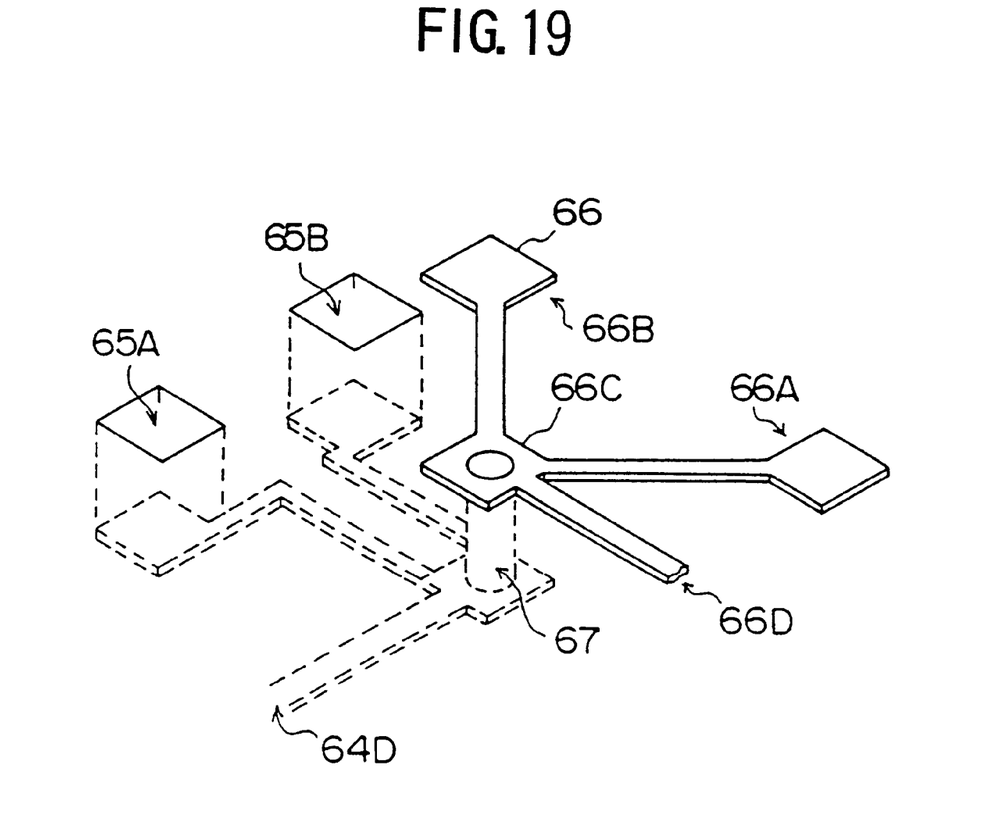
FIG. 19 is a diagram of an application of the third embodiment of the present invention.

The structure shown in FIG. 16 can be applied to an actually used contact between the upper and lower wiring lines. Such an application is illustrated in FIG. 19, in which parts that are the same as those shown in the previously described figures are given the same reference numbers. The first conductive layer 64 and the second conductive layer 66 are provided to a contact portion 67 in which wiring layers 64D and 66D are connected. In this case, the contact resistance of the real wiring layers can be measured. It is preferable that the structure shown in FIG. 19 is applied to important signal lines, which may be a bus for a clock signal.

The present invention is not limited to the specifically disclosed embodiments, and variations and modifications may be made without departing from the scope of the present invention.

What is claimed is:

1. A wiring board structure comprising:
   a board made of a material etched by a given solution;
   an inner conductive device disposed within said board and having a first portion extending parallel to a surface of said board and a second portion connected to said first portion, said second portion extending perpendicular to and past said surface of said board;
   an insulating layer having a portion which is in contact with said surface of said board and in contact with only a side surface of said second portion of said inner conductive device extending past said surface of said board;

an electrically conductive layer disposed on top of said insulating layer and connected to an exposed surface of said second portion of said inner conductive device;

a second insulating layer disposed over said electrically conductive layer and having a window via hole located over said second portion of said inner conductive device; and a surface conductive layer disposed over said second insulating layer, extending into said window via hole in said second insulating layer, and contacting said electrically conductive layer, wherein said insulating layer prevents a gap etched between said electrically conductive layer and said board.

2. The wiring board structure as claimed in claim 1, wherein:

said board has a via hole;

said second portion of said inner conductive device is provided in the via hole; and said via hole has a size smaller than that of said window via hole.

3. The wiring board structure as claimed in claim 1, wherein said insulating layer is made of an insulating material which can be grown at a temperature lower than a burning-in temperature of the material making up said board.

4. The wiring board structure as claimed in claim 2, wherein said insulating layer is made of an insulating material which can be grown at a temperature lower than a burning-in temperature of the material making up said board.

5. A wiring board structure comprising:

a board;

a multilayered wiring structure provided on said board;

a plurality of thermally conductive members provided in holes formed in said multilayered wiring structure, each of said plurality of thermally conductive members having an upper portion with a diameter larger than a diameter of a lower portion, said upper portion of each of said plurality of thermally conductive members forming a bump above each of said holes, said lower portion contacting one side of an electrical conducting layer in said multilayered wiring structure, and a second side of the electrical conducting layer contacting said board; and an electronic mounting element capable of generating heat and mounted on said bump of each of said plurality of thermally conductive members which are capable of dissipating the heat from said mounting element.

6. A wiring board structure comprising:

a multilayered wiring structure having first and second electrically conductive layers, between which an insulating layer is interposed, and a contact portion which is formed along a side of a first opening in said insulating layer, said contact portion connecting the first and second electrically conductive layers, a portion of said first electrically conductive layer within said first opening, not contacting said contact portion, being externally exposed;

first lands externally exposed to a side of said multilayered wiring structure having said second electrically conductive layer through second openings, different from said first opening, in the insulating layer, said first lands being located at positions of said first electrically conductive layer defined within said second opening; and second lands externally exposed and located at positions of said second electrically conductive layer, a measurement instrument for measuring a resistance of said contact portion being connectable to said first and second lands.

7. A semiconductor device comprising:

a board having an inner conductive wiring layer;

an electrically conductive layer connected to said inner conductive wiring layer at a first portion of said board;

a multilayered wiring structure located apart from said electrically conductive layer and having a first wiring layer connected to said inner conductive wiring layer at a second portion of said board; and an insulating layer underlying a lower portion of said electrically conductive layer to prevent a gap etched in said board at an edge of said electrically conductive layer when said electrically conductive layer is etched and underlying a lower portion of said first wiring layer of said multilayered wiring structure to prevent the gap etched in said board when said first wiring layer of said multilayered wiring structure is etched.

8. A semiconductor device comprising:

a board having an inner conductive wiring layer;

an electrically conductive layer formed over a surface of said board and connected to said inner conductive wiring layer at a first portion of said board;

a multilayered wiring structure located apart from said electrically conductive layer and having a first wiring layer formed over the surface of said board and connected to said inner conductive wiring layer at a second portion of said board; and an insulating layer disposed over a peripheral portion of said electrically conductive layer to prevent a gap etched in said board at an edge of said electrically conductive layer when said electrically conductive layer is etched and disposed over a peripheral portion of said first wiring layer of said multilayered wiring structure to prevent the gap etched in said board at an edge of said first wiring layer when said first wiring layer of said multilayered wiring structure is etched.

* * * * *